(12) United States Patent
Kosugi et al.

(10) Patent No.: US 12,241,159 B2
(45) Date of Patent: Mar. 4, 2025

(54) SUBSTRATE PROCESSING APPARATUS AND CEILING HEATER

(71) Applicant: KOKUSAI ELECTRIC CORPORATION, Tokyo (JP)

(72) Inventors: Tetsuya Kosugi, Toyama (JP); Hitoshi Murata, Toyama (JP); Shuhei Saido, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 921 days.

(21) Appl. No.: 16/427,395

(22) Filed: May 31, 2019

(65) Prior Publication Data

US 2019/0284696 A1  Sep. 19, 2019

Related U.S. Application Data

(63) Continuation of application No. PCT/JP2017/034052, filed on Sep. 21, 2017.

(30) Foreign Application Priority Data

Dec. 1, 2016  (JP) .................................. 2016-234166

(51) Int. Cl.
  *C23C 16/46* (2006.01)
  *C23C 16/52* (2006.01)
  (Continued)

(52) U.S. Cl.
  CPC .............. *C23C 16/46* (2013.01); *C23C 16/52* (2013.01); *H01L 21/31* (2013.01);
  (Continued)

(58) Field of Classification Search
  USPC .................. 118/725; 219/385, 520; 437/120; 432/120; 165/168
  See application file for complete search history.

(56) References Cited

U.S. PATENT DOCUMENTS

| | | | |
|---|---|---|---|
| 2004/0149718 A1* | 8/2004 | Ito ..................... | H01L 21/67103 219/444.1 |
| 2010/0240224 A1 | 9/2010 | Wu et al. | |
| 2011/0021039 A1* | 1/2011 | Murata ............. | H01L 21/67109 257/E21.328 |

FOREIGN PATENT DOCUMENTS

| | | |
|---|---|---|
| JP | 2001-313155 A | 11/2001 |
| JP | 2003-059837 A | 2/2003 |

(Continued)

OTHER PUBLICATIONS

English Translation JP2004-327528 (Year: 200).*

(Continued)

*Primary Examiner* — Yewebdar T Tadesse
(74) *Attorney, Agent, or Firm* — Volpe Koenig (57) ABSTRACT

According to the technique of the present disclosure, there is provided a substrate processing apparatus including: a reaction tube accommodating therein a plurality of substrates vertically arranged; and a first heater configured to heat an inside of the reaction tube from an upper portion of the reaction tube, wherein a heat generating amount of the first heater in a region corresponding to a low temperature portion of an upper substrate among the plurality of the substrates accommodated in the reaction tube is greater than a heat generating amount of the first heater in a region corresponding to a high temperature portion of the upper substrate.

17 Claims, 9 Drawing Sheets

(51) Int. Cl.
  *H01L 21/31* (2006.01)
  *H01L 21/67* (2006.01)
  *H01L 21/673* (2006.01)

(52) U.S. Cl.
  CPC .. *H01L 21/67103* (2013.01); *H01L 21/67109* (2013.01); *H01L 21/67248* (2013.01); *H01L 21/67303* (2013.01)

(56) References Cited

FOREIGN PATENT DOCUMENTS

| | | | |
|---|---|---|---|
| JP | 2004-214283 A | | 7/2004 |
| JP | 2004-327528 A | | 11/2004 |
| JP | 2005-032883 A | | 2/2005 |
| JP | 2005-136370 A | | 5/2005 |
| JP | 2009-010195 A | | 1/2009 |
| KR | 20060051861 A | * | 5/2006 |
| KR | 10-2009-0069938 A | | 7/2009 |

OTHER PUBLICATIONS

English Translation KR20060051861A (Year: 2006).*
Japanese Office Action dated Apr. 14, 2020 for the Japanese Patent Application No. 2018-553676.
Korean Office Action issued on Sep. 29, 2020 for Korean Patent Application No. 10-2019-7015388.
Korean Office Action issued on May 11, 2021 for Korean Patent Application No. 10-2019-7015388.

* cited by examiner

|  | CEILING HEATER OFF | CEILING HEATER ON |
|---|---|---|
| TEMPERATURE DISTRIBUTION OF CEILING HEATER | FLAT DISTRIBUTION | CONVEX DISTRIBUTION |
| TEMPERATURE DISTRIBUTION OF UPPERMOST WAFER | CONCAVE DISTRIBUTION | FLAT DISTRIBUTION |

−50℃  AVERAGE TEMPERATURE  +50℃

FIG. 10

SUBSTRATE PROCESSING APPARATUS AND CEILING HEATER

CROSS-REFERENCE TO RELATED PATENT APPLICATION

This non-provisional U.S. patent application claims priority under 35 U.S.C. § 119 of International Application No. PCT/JP2017/034052, filed on Sep. 21, 2017, in the WIPO, and Japanese Patent Application No. 2016-234166, filed on Dec. 1, 2016, in the Japanese Patent Office, the entire contents of which are hereby incorporated by reference.

BACKGROUND

1. Field

The present disclosure relates to a substrate processing apparatus and a ceiling heater.

2. Description of the Related Art

For example, a vertical type substrate processing apparatus capable of batch-processing a plurality of substrates (also referred to as "a plurality of wafers") is used in a substrate processing of manufacturing processes of a semiconductor device. In the vertical type substrate processing apparatus, a process of forming a film on the plurality of the substrates is performed by accommodating the plurality of the substrates in a process vessel and supplying a process gas into the process vessel while heating an inside of the process vessel by a heater provided so as to surround the process vessel. For example, the plurality of the substrates accommodated in the process vessel is vertically arranged in a horizontal orientation in a multistage manner. In the vertical type substrate processing apparatus, while elevating the temperature of the plurality of the substrates, a temperature deviation may occur between an uppermost wafer among the plurality of the substrates and a lowermost wafer among the plurality of the substrates. Therefore, the time for stabilizing the temperature of the plurality of the substrates (wafers) may be prolonged.

As described above, when the temperature deviation occurs between the uppermost wafer and the lowermost wafer, the time for stabilizing the temperature of the plurality of the substrates may be prolonged.

SUMMARY

Described herein is a technique capable of shortening the time for stabilizing the temperature of the plurality of the substrates.

According to the technique of the present disclosure, there is provided a substrate processing apparatus including: a reaction tube accommodating therein a plurality of substrates vertically arranged; and a first heater configured to heat an inside of the reaction tube from an upper portion of the reaction tube, wherein a heat generating amount of the first heater in a region corresponding to a low temperature portion of an upper substrate among the plurality of the substrates accommodated in the reaction tube is greater than a heat generating amount of the first heater in a region corresponding to a high temperature portion of the upper substrate.

DETAILED DESCRIPTION

Embodiments

Figure 1:
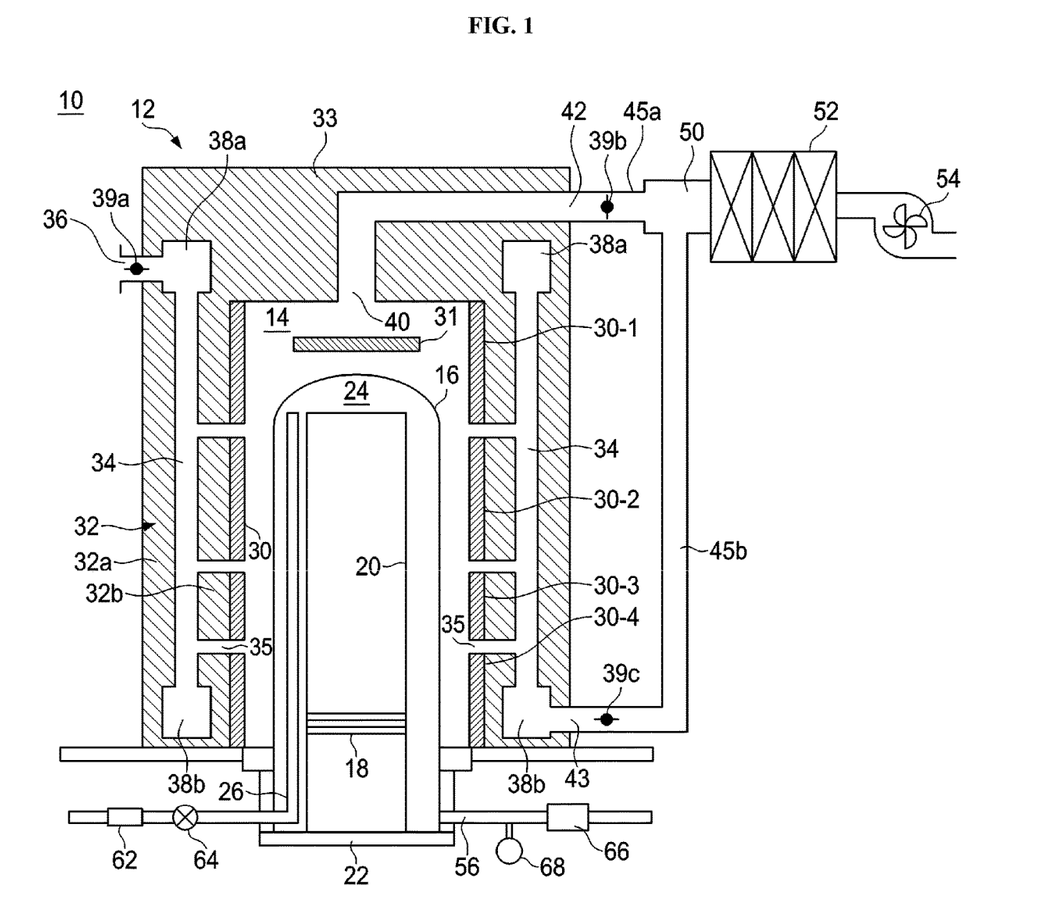
FIG. 1 schematically illustrates a vertical cross-section of a substrate processing apparatus according to one or more embodiments described herein.

Hereinafter, one or more embodiments (hereinafter, simply referred to as "embodiments") according to the technique will be described with reference to the drawings. A substrate processing apparatus 10 according to the embodiments will be described with reference to FIG. 1. As shown in FIG. 1, the substrate processing apparatus 10 according to the embodiments includes: a cylindrical heating device 2; a cylindrical reaction tube 16 provided in an inner furnace space 14 inside of the heating device 12; and a boat 20 serving as a substrate retainer capable of accommodating (supporting) a plurality of wafers including a wafer 18 to be processed in the reaction tube 16. In the present disclosure, the wafer 18 may also be referred to as a substrate 18. The boat 20 is configured to support the plurality of the wafers including the wafer 18 in the reaction tube 16 while the plurality of the wafers supported by the boat 20 is vertically arranged in a horizontal orientation in a multistage manner. The boat 20 is placed on a boat elevator (not shown) through a cap 22, and can be moved upward or downward by the boat elevator. Therefore, the boat 20 with the plurality of the wafers may be transferred (loaded) into the reaction tube 16 and transferred (unloaded) out of the reaction tube 16 by an operation of the boat elevator.

A process chamber 24 where the plurality of the wafers including the wafer 18 is accommodated is enclosed by the reaction tube 16. A gas introduction pipe 26 communicating with the reaction tube 16 is provided. A process gas supply source (not shown), a mass flow controller (WC) 62 serving as a flow rate controller (flow rate control mechanism) and a valve 64 serving as an opening/closing valve are installed in order at the gas introduction pipe 26 from an upstream side to a downstream side of the gas introduction pipe 26. A gas exhaust pipe 56 communicating with the reaction tube 16 is provided to exhaust an inner atmosphere of the process chamber 24. A pressure sensor 68 and an APC valve 66 serving as a pressure adjusting device are installed in order at the gas exhaust pipe 56 from an upstream side to a downstream side of the gas exhaust pipe 56.

The heating device 12 is cylindrical, and further includes a side heat generating part (hereinafter, also referred to as a "side heater") 30 serving as a side heating part and an upper heat generating part (hereinafter, also referred to as a "ceiling heater") 31 serving as an upper heating part. The side heater 30 is provided at an inner side of a heat insulating structure having a configuration in which a plurality of heat insulating bodies are stacked, and is configured to heat the inner furnace space 14 from a side portion of the inner furnace space 14. The ceiling heater 31 is configured to heat the inner furnace space 14 from an upper portion of the inner furnace space 14. The ceiling heater 31 is provided below an upper wall portion 33 of the heat insulating structure and above the reaction tube 16. The side heater 30 is divided into a plurality of zones along a wafer loading direction, for example, is divided into four zones 30-1, 30-2, 30-3 and 30-4 from a top of the side heater 30. The side heater 30 is configured to control a heating temperature individually in each of the divided zones 30-1, 30-2, 30-3 and 30-4. The ceiling heater 31 will be described later in detail.

The heat insulating structure includes a sidewall portion 32 serving as a cylindrical heat insulating part and an upper wall portion 33 configured to cover an upper end of the side wall portion 32. The sidewall portion 32 has a multilayer structure. That is, the sidewall portion 32 includes a sidewall outer layer 32a serving as an outer side layer of the multilayer structure of the sidewall portion 32 and a sidewall inner layer 32b serving as an inner side layer of the multilayer structure of the sidewall portion 32. A cylindrical space 34 serving as a cooling gas passage is provided between the sidewall outer layer 32a and the sidewall inner layer 32b. The side heater 30 is provided on an inner surface of the side wall inner layer 32b, and an inner portion of the side heater 30 serves as a heat generating region. While the embodiments will be described by way of an example in which the sidewall portion 32 has the multilayer structure in which the plurality of the heat insulating bodies are stacked, the structure of the sidewall portion 32 is not limited thereto.

A cooling gas supply port 36 is provided at an upper portion of the sidewall outer layer 32a. A cooling gas discharge port 43 is provided at a lower portion of the sidewall outer layer 32a. A rapid-cooling gas discharge port 42 and the cooling gas discharge port 43 are connected to exhaust pipes 45a and 45b, respectively, and are joined together at a duct 50. A radiator 52 and an exhaust fan 54 are connected to the duct 50 from an upstream side to a downstream side of the duct 50. A cooling gas heated in the heating device 12 is discharged to the outside of the substrate processing apparatus 10 through the duct 50, the radiator 52 and the exhaust fan 54 described above.

A valve 39a serving as an opening/closing valve is provided in the vicinity of the cooling gas supply port 36 and a duct 38a. A valve 39b serving as an opening/closing valve is provided in the vicinity of the rapid-cooling gas discharge port 42 and the duct 50. A valve 39c serving as an opening/closing valve is provided in the vicinity of the cooling gas discharge port 43 and a duct 38b. By providing the valves 39b and 39c in the vicinity of the duct 50 and the duct 38b, respectively, it is possible to reduce the influence of the convection from the duct 50 and the duct 38b to the rapid-cooling gas discharge port 42 and the cooling gas discharge port 43 when the valves 39b and 39c are not in use. It is also possible to improve a temperature uniformity on a surface of the wafer 18 in the vicinity of the duct 50 and the duct 38b.

The supply of the cooling gas is adjusted (operated) by opening or closing the valve 39a and turning on or off the exhaust fan 54. The cooling gas passage 34 is closed or opened by opening or closing the valve 39b or the valve 39c and turning on or off the exhaust fan 54. Thereby, the cooling gas may be discharged through the rapid-cooling gas discharge port 42 or the cooling gas discharge port 43, respectively.

Figure 2:
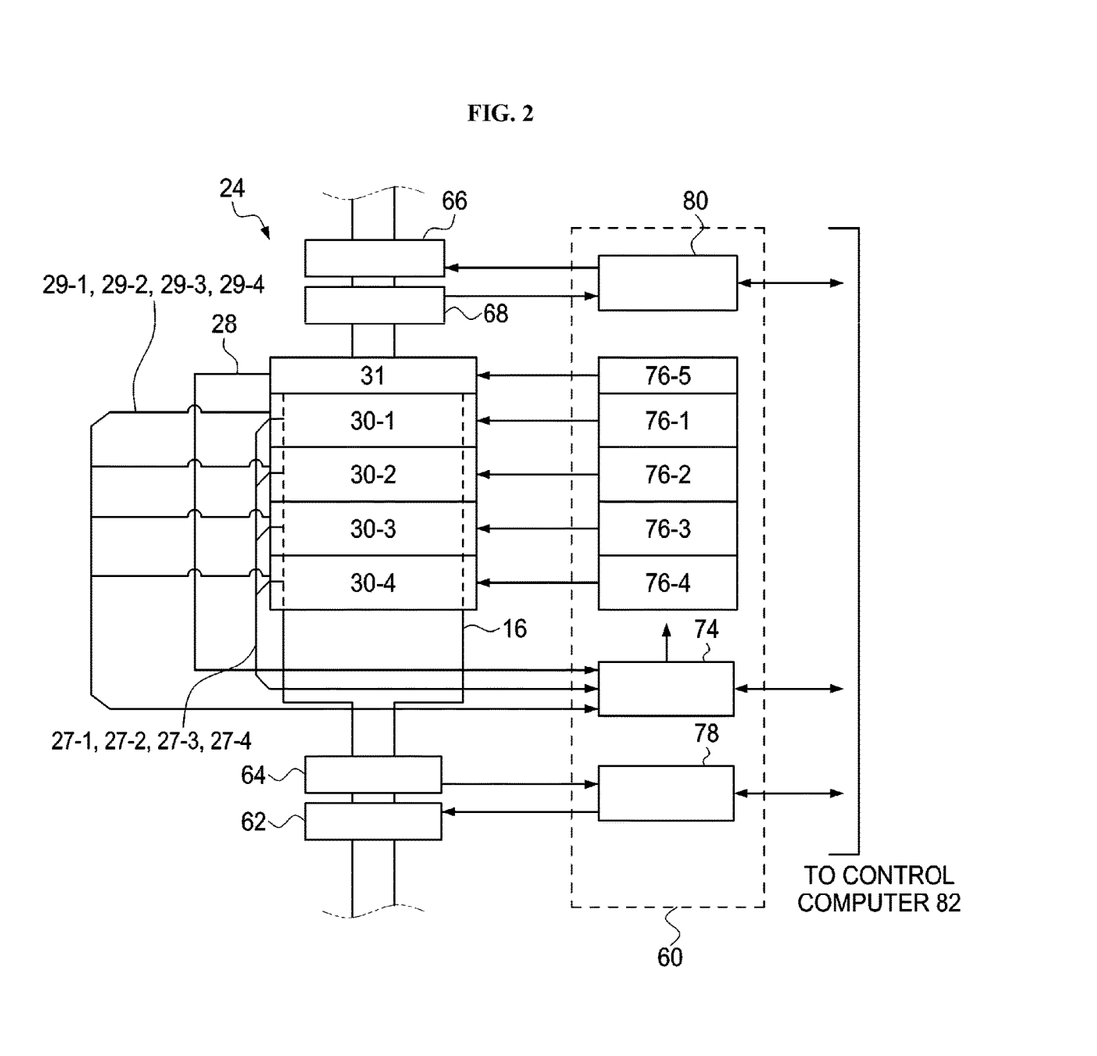
FIG. 2 schematically illustrates a configuration of a controller of the substrate processing apparatus according to the embodiments described herein and a relationship between the controller and a semiconductor manufacturing apparatus serving as the substrate processing apparatus.

As shown in FIG. 2, first temperature sensors 27-1, 27-2, 27-3 and 27-4 serving as temperature detectors are installed at each of the plurality of the zones of the side heater 30. A second temperature sensor 28 is installed at the ceiling heater 31. Third temperature sensors 29-1, 29-2, 29-3 and 29-4 are installed in the process chamber 24. The third temperature sensors may be installed only when acquiring a profile of substrate processing apparatus 10 at the time of the startup of substrate processing apparatus 10, and may be removed from the process chamber 24 when performing a film-forming process described later.

Hereinafter, a configuration of a controller serving as a control device will be described. As shown in FIG. 2, a controller 60 controls the components of a semiconductor manufacturing apparatus serving as the substrate processing apparatus 10 such as the first temperature sensors 27-1, 27-2, 27-3 and 27-4, the second temperature sensor 28, the third temperature sensors 29-1, 29-2, 29-3 and 29-4, the MFC 62, the valve 64, 39a, 39b and 39c and the APC valve 66 based on values such as temperatures, pressures and flow rates set by a control computer 82 described later.

A temperature controller 74 serving as a temperature control device is configured to control heater driving devices 76-1, 76-2, 76-3 and 76-4, respectively. Specifically, the temperature controller 74 controls the electric power supplied by the heater driving devices 76-1, 76-2, 76-3 and 76-4 to each of the zones 30-1, 30-2, 30-3 and 30-4 of the side heater 30, respectively, such that that temperatures measured by the first temperature sensors 27-1, 27-2, 27-3 and 27-4 reach the temperatures set by the control computer 82. In addition, the temperature controller 74 controls the electric power supplied by the heater driving device 76-1 and a heater driving device 76-5 to the zone 30-1 and the ceiling heater 31, respectively, such that the temperatures measured by the first temperature sensor 27-1 and the second temperature sensor 28 reach the temperatures set by the control computer 82, specifically, such that the temperature of an upper wafer (for example, an uppermost wafer) among the plurality of the wafers including the wafer 18 reaches a desired temperature.

A flow rate controller 78 serving as a flow rate control device is configured to control a gas flow rate regulator 62 so as to control a flow rate of a gas introduced into the process chamber 24 of the reaction tube 16. That is, the flow rate controller 78 controls the MFC (gas flow rate regulator) 62 such the flow rate of the gas measured by a flow rate sensor 64 reaches the flow rate of the gas set by the control computer 82. A pressure controller 80 serving as a pressure control device is configured to control the APC valve 66 so as to control a pressure of the process chamber 24. That is, the pressure controller 80 controls the APC valve 66 such that an inner pressure of the reaction tube 16 measured by the pressure sensor 68 reaches the pressure set by the control computer 82.

<Hardware Configuration>

Figure 3:
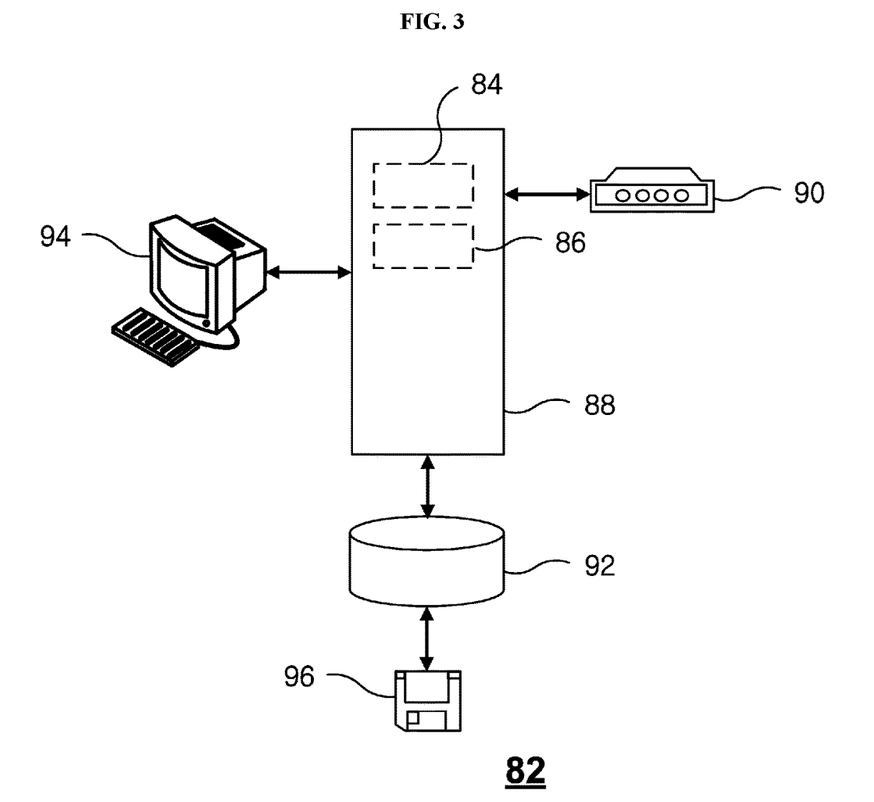
FIG. 3 schematically illustrates a hardware configuration of a control computer of the substrate processing apparatus according to the embodiments described herein.

FIG. 3 schematically illustrates a configuration of the control computer 82. The control computer 82 includes a computer main body 88 including components such as a CPU (Central Processing Unit) 84 and a memory 86; a communication IF (interface) 90; a memory device 92; and a display/input device 94. That is, the control computer 82 includes components constituting a general-purpose computer.

The CPU 84 constitutes a backbone of the control computer 82. The CPU 84 is configured to execute a control program stored in the memory device 92 and a recipe stored in the memory device 92 (for example, a process recipe) according to an instruction from the display/input device 94.

As a recording medium 96 for storing data such as an operation program of the CPU 84, components such as a ROM (Read Only Memory), an EEPROM (Electrically Erasable Programmable Read Only Memory), a flash memory and a hard disk may be used. In the present specification, a RAM (Random Access Memory) functions as a component such as a work area of the CPU 84.

While the embodiments will be described by way of an example in which the control computer 82 is embodied by a dedicated computer system, the control computer 82 is not limited thereto. For example, the control computer 82 may be embodied by a general computer system. For example, the control computer 82 may be embodied by installing in a general computer a program for executing the above-described process from the recording medium 96 such as a flexible disk, a CD-ROM and a USB which stores the program.

For example, the program may be provided through the communication interface 90 such as a communication line, a communication network and a communication system. In addition, the program may be posted on a bulletin board on the communication network, and may be provided by being superimposed on the carrier wave via the network. The program provided as described above may be executed to perform the above-described process under an OS (operating system) just like any other application programs.

Hereinafter, an example of a process (film-forming process) of forming a film on the wafer 18 using a heat treatment apparatus (that is, the substrate processing apparatus 10) will be described. In the film-forming process, for example, DCS (SiH$_2$Cl$_2$: dichlorosilane) gas serving as a source gas and NH$_3$ (ammonia) gas serving as a reactive gas are supplied to the wafer 18 to form a silicon nitride (SiN) film on the wafer 18.

<Wafer Charging and Boat Loading Step>

After the boat 20 is charged with the plurality of the wafers including the wafer 18 (wafer charging), the boat 20 is elevated by the boat elevator (not shown) and loaded into the process chamber 24 (boat loading). With the boat 20 loaded, the cap 22 hermetically seals (closes) a lower end opening of the reaction tube 22.

<Pressure Adjusting Step>

A vacuum pump (not shown) exhausts (vacuum-exhausts) the inner atmosphere of the process chamber 24 until an inner pressure of the process chamber 24 reaches a desired pressure (vacuum degree). In the pressure adjusting step, the inner pressure of the process chamber 24 is measured by the pressure sensor 68, and the APC valve 66 is feedback-controlled based on the measured pressure.

<Temperature Adjusting Step>

The side heater 30 and the ceiling heater 31 heat the process chamber 24 such that the temperature of the plurality of the wafers including the wafer 18 in the process chamber 24 reaches a desired temperature and maintains the desired temperature. The amounts of the current flowing to the side heater 30 and the ceiling heater 31 are feedback-controlled based on the temperatures detected by the first temperature sensors 27-1, 27-2, 27-3 and 27-4 and the second temperature sensor 28 such that an inner temperature of the process chamber 24 has a desired temperature distribution. In order to control (adjust) the temperature of the upper wafer (for example, the uppermost wafer) in the process chamber 24, the amounts of the current flowing to the zone 30-1 and the ceiling heater 31 are feedback-controlled. A boat rotating mechanism (not shown) of the substrate processing apparatus 10 starts to rotate the boat 20 and the plurality of the wafers including the wafer 18. As the boat rotating mechanism rotates the boat 20, the plurality of the wafers including the wafer 18 supported by the boat 20 are rotated. Until at least the process for the wafer 18 is completed, the boat rotating mechanism continuously rotates the boat 20 and the plurality of the wafers. The side heater 30 and the ceiling heater 31 continuously heat the process chamber 24 until at least the film-forming process for the wafer 18 is completed. The electric power applied to the ceiling heater 31 may be controlled such that the heating amount of the ceiling heater 31 during the film-forming process is less than that of the ceiling heater 31 during the temperature adjusting step.

<Film-Forming Process>

<Source Gas Supply Step>

After the inner temperature of the process chamber 24 is stabilized at a predetermined processing temperature, the DCS gas is supplied to the wafer 18 in the process chamber 24. A flow rate of the DCS gas is adjusted by the MFC 62, and the DCS gas with the flow rate thereof adjusted is supplied to the wafer 18 through the gas introduction pipe 26.

<Source Gas Exhaust Step>

Next, the supply of the DCS gas is stopped, and the vacuum pump vacuum-exhausts the inner atmosphere of the process chamber 24. In the source gas exhaust step, N$_2$ gas serving as an inert gas may be supplied into the process chamber 24 (purge by inert gas).

<Reactive Gas Supply Step>

Next, the NH$_3$ gas is supplied to the wafer 18 in the process chamber 24 in the sequence same as that of the source gas supply step.

<Reactive Gas Exhaust Step>

Next, the supply of the NH$_3$ gas is stopped, and the vacuum pump vacuum-exhausts the inner atmosphere of the process chamber 24. In the reactive gas exhaust step, the N$_2$ gas may be supplied into the process chamber 24 (purge by inert gas).

By performing a cycle including the source gas supply step, the source gas exhaust step, the reactive gas supply step and the reactive gas exhaust step a predetermined number of times (at least once), it is possible to form the silicon nitride (SiN) film having a predetermined composition and a predetermined thickness on the surface of the wafer 18.

<Boat Unloading and Wafer Discharging Step>

After the silicon nitride film having the predetermined thickness is formed, the N$_2$ gas is supplied into the process chamber 24. The inner atmosphere of the process chamber 24 is replaced with the N$_2$ gas, and the inner pressure of the process chamber 24 is returned to a normal pressure. Thereafter, the cap 22 is lowered by the boat elevator, and the boat 20 is unloaded out of the reaction tube 16 (boat unloading). Thereafter, the processed wafer 18 is then unloaded (discharged) from the boat 20 (wafer discharging).

For example, the process conditions for forming the SiN film on the wafer 18 are as follows:
Temperature (wafer temperature): 300° C. to 700° C.;
Pressure (the inner pressure of the process chamber): 1 Pa to 4,000 Pa;
Flow rate of DCS gas: 100 sccm to 10,000 sccm;
Flow rate of $NH_3$ gas: 100 sccm to 10,000 sccm; and
Flow rate of $N_2$ gas: 100 sccm to 10,000 sccm.

By selecting suitable values within these process conditions described above, it is possible to perform the film-forming process properly.

Figure 4:
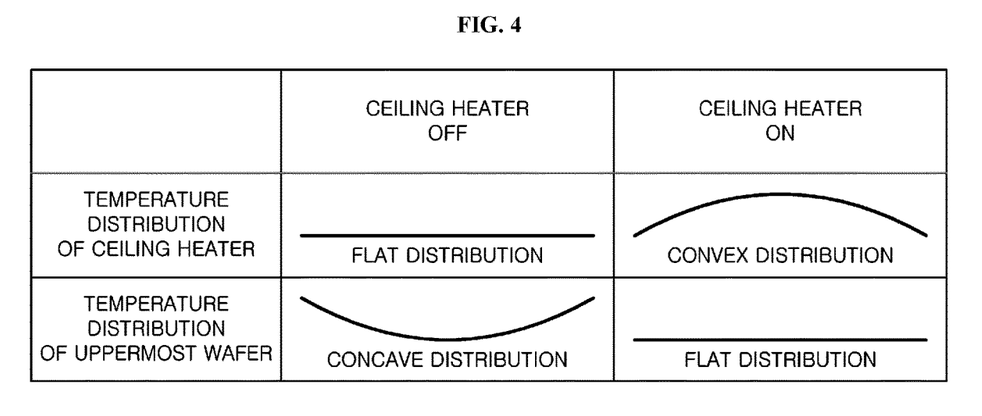
FIG. 4 schematically illustrates a relationship between a temperature distribution of a cross-section of a ceiling heater of the substrate processing apparatus and a temperature distribution of a cross-section of an uppermost wafer accommodated in the substrate processing apparatus.

Hereinafter, a temperature distribution on a surface of the upper wafer in the process chamber 24 will be described. As shown in FIG. 4, when the upper wafer is heated only by the side heater 30 (that is, the ceiling heater 31 is turned off), a peripheral portion of the upper wafer is actively heated. Due to an influence of the heat escape, in particular, the heating at a central portion of the upper wafer is insufficient. As a result, the temperature distribution on the surface of the upper wafer may vary, and a temperature uniformity on the surface of the upper wafer may deteriorate. That is, when the upper wafer is heated only by the side heater 30, the temperature distribution on the surface of the upper wafer may become a concave distribution in which the temperature at the central portion of the upper wafer is low.

As a result of intensive research, the inventors of the present application have confirmed that it is possible to improve the temperature uniformity on the surface of the upper wafer and the temperature uniformity between wafers among the plurality of the wafers by changing a heating amount distribution of the ceiling heater 31 to flatten the temperature distribution on the surface of the upper wafer. For example, in order to change the heating amount distribution of the ceiling heater 31, an outer diameter of the ceiling heater 31 is set greater than an outer diameter of the upper wafer.

For example, as shown in FIG. 4, when the temperature distribution on the surface of the amount upper wafer heated only by the side heater 30 is a concave distribution, the heating amount distribution of the ceiling heater 31 itself is set as a convex distribution. Therefore, it is possible to substantially flatten the temperature distribution on the surface of the upper wafer by actively heating a portion where the temperature of the upper most wafer is low (also referred to as a "low temperature portion") such that the temperature of the low temperature portion is adjusted to the temperature of a portion where the temperature of the upper most wafer is high (also referred to as a "high temperature portion"). That is, the upper wafer can be heated by the ceiling heater 31 whose heating amount distribution is the convex distribution described above.

Figure 5:
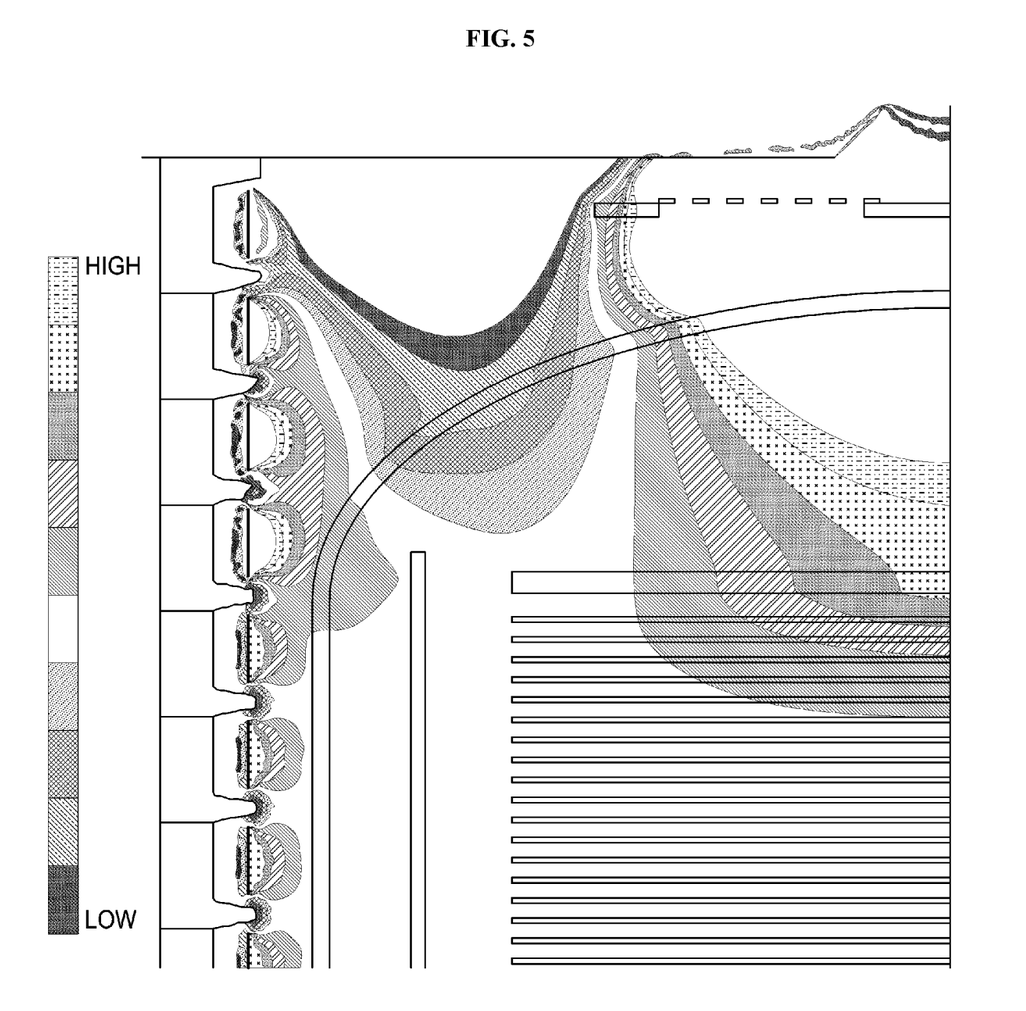
FIG. 5 schematically illustrates a temperature distribution of an upper portion in a reaction tube of the substrate processing apparatus by a ceiling heater according to a comparative example.

As a comparative example, the temperature distribution of an upper portion in the reaction tube 16 when an outside diameter of a ceiling heater is less than the outside diameter of the wafer (for example, the uppermost wafer) is shown in FIG. 5. As shown in FIG. 5, the influence of the heating by the ceiling heater according to the comparative example, which is indicated at the top of the reaction tube 16 in FIG. 5 by a white portion through a dark portion, reaches about 5 wafers from the top of the reaction tube 16. That is, when the outside diameter of the ceiling heater according to the comparative example is less than the outside diameter of the wafer (for example, the uppermost wafer), a heat generating amount (that is, the heating amount of the ceiling heater according to the comparative example) is insufficient. Therefore, the ceiling heater according to the comparative example can be used only for the auxiliary heating when stabilizing the temperature.

Figure 6:
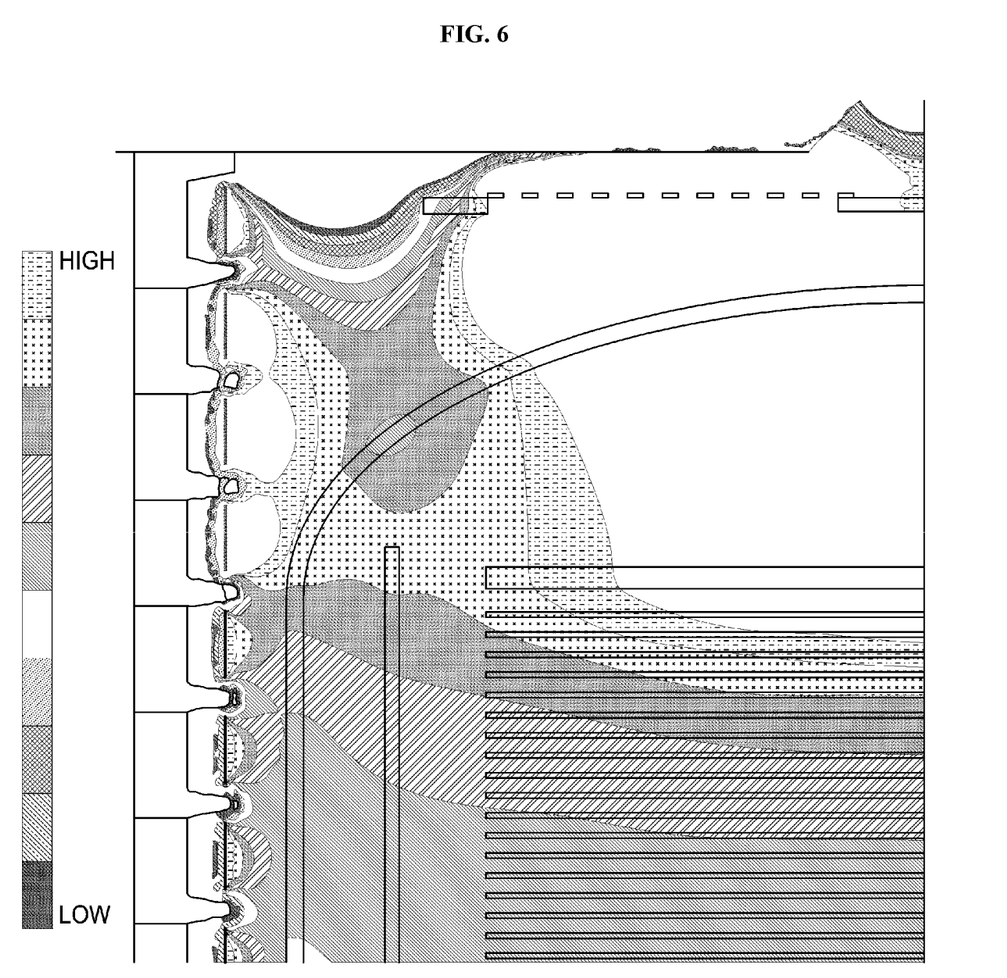
FIG. 6 schematically illustrates a temperature distribution of the upper portion in the reaction tube of the substrate processing apparatus by the ceiling heater according to the embodiments described herein.

The temperature distribution of the upper portion in the reaction tube 16 when the outside diameter of the ceiling heater 31 according to the embodiments is greater than the outside diameter of the upper wafer is shown in FIG. 6. As shown in FIG. 6, the influence of the heating by the ceiling heater 31 according to the embodiments, which is indicated at the top of the reaction tube 16 in FIG. 6 by a white portion through a dark portion, reaches about 15 wafers from the top of the reaction tube 16. That is, when the outside diameter of the ceiling heater 31 according to the embodiments is greater than the outside diameter of the upper wafer, the heat generating amount (that is, the heating amount of the ceiling heater 31 according to the embodiments) is sufficient. Therefore, the ceiling heater 31 according to the embodiments can be used efficiently not only for the auxiliary heating when stabilizing the temperature but also for the heating when elevating the temperature.

While the temperature of the plurality of the wafers including the wafer 18 is elevated, the heating amount in a peripheral direction of the plurality of the wafers by the side heater 30 is increased. The temperature distribution on the surface of the upper wafer when elevating the temperature tends to have a strong concave distribution than that of the upper wafer when stabilizing the temperature. Therefore, by turning on the ceiling heater 31 when elevating the temperature of the plurality of the wafers, it is possible to further improve a temperature controllability of the upper wafer. The heating amount of the ceiling heater 31, in other words, a heat generating amount of a heat generating element described later, is determined by parameters such as a surface load density [unit: $W/cm^2$] and a current density [unit: $A/mm^2$] of the ceiling heater 31. Therefore, by adjusting the surface load density and the current density of the ceiling heater 31, it is possible to form any heating amount distribution in the ceiling heater 31.

The surface load density is represented by the electric power applied per unit area, and the higher the surface load density, the higher a surface temperature of the ceiling heater 31. It is possible to increase the surface load density by increasing the applied electric power to the heat generating element itself or by increasing a winding density of the heat generating element.

The current density is represented by the current flowing per unit area, and the larger the current density, the higher the surface temperature of the ceiling heater 31. It is possible to increase the current density by increasing a cross-sectional area of the heat generating element.

First Embodiment

Figure 7:
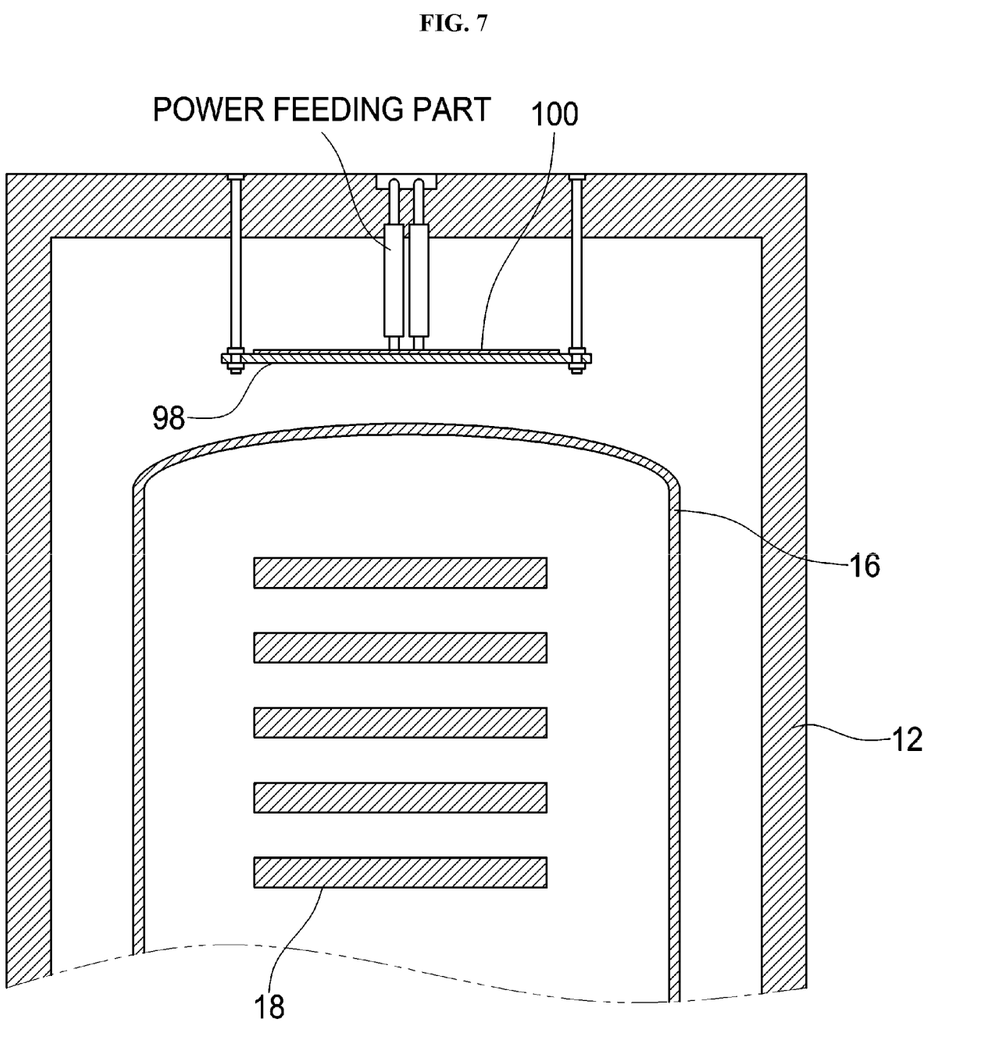
FIG. 7 schematically illustrates an installation state of the ceiling heater according to the embodiments described herein.

Hereinafter, a configuration of the ceiling heater 31 will be described with reference to FIGS. 7 and 8. As shown in FIG. 7, the ceiling heater 31 is constituted by a circular quartz plate 98 and a heat generating element 100 which is a heat generating element wire. The heat generating element 100 is installed on the circular quartz plate 98, and the ceiling heater 31 is provided by arranging the quartz plate 98 above the reaction tube 16. The outer diameters of the ceiling heater 31 and the heat generating element 100 are equal to or greater than the outer diameter of the wafer 18.

Figure 8:
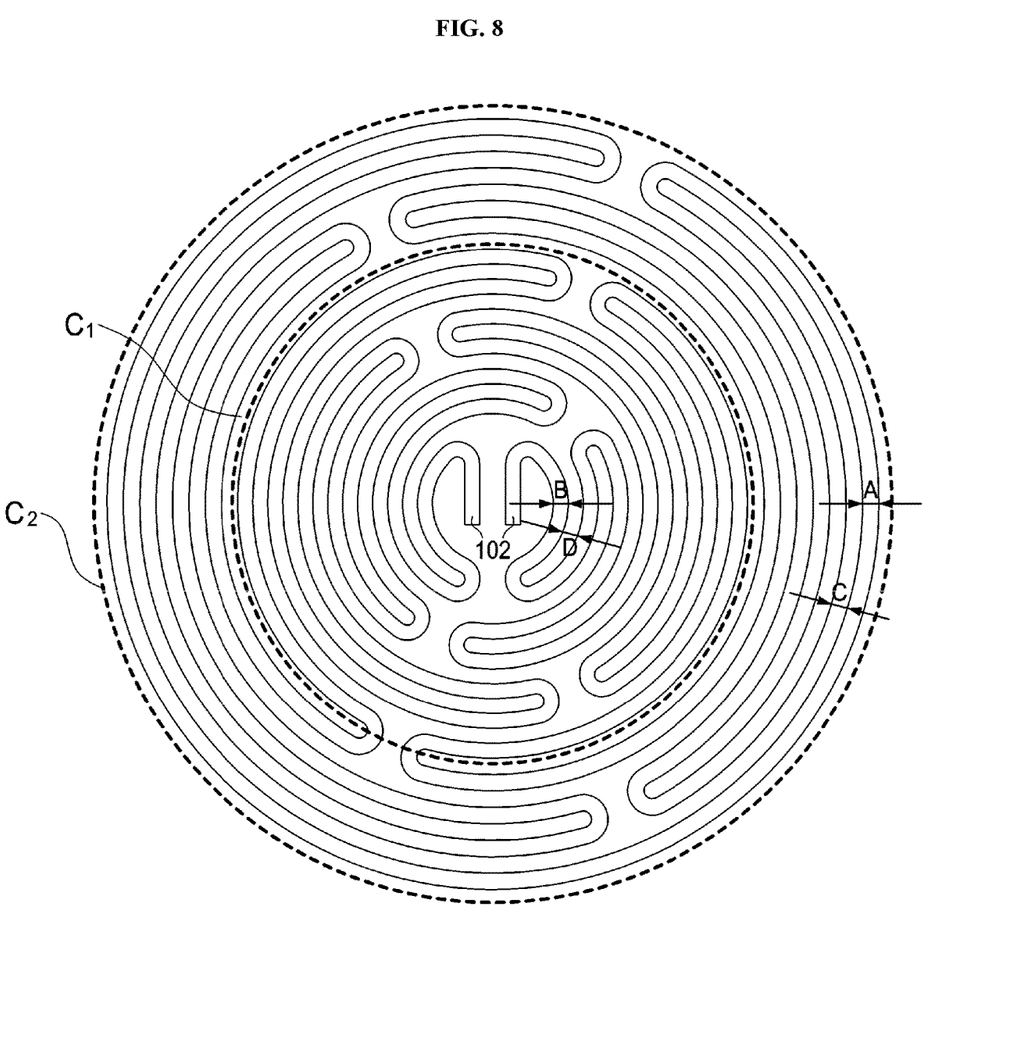
FIG. 8 schematically illustrates the ceiling heater according to the embodiments described herein when viewed from above.

As shown in FIG. 8, the heat generating element 100 is formed in a winding structure similar to a spiral swirling outward from a center of the ceiling heater 31 along concentric semicircles. End portions 102 of the heat generating element 100 provided at the center of the ceiling heater 31 serve as feed ends to which power feed lines (also referred to as a "power feeding part") are connected. The heat generating element 100 extends from one of the end portions 102 along a semicircle to form an arc portion, then extends outward in the radial direction at a turnaround portion, and then extends along a larger semicircle in a direction opposite to that of the above-mentioned arc portion to form another arc portion. By repeating the above pattern which includes extending in a reversing direction along a next semicircle with a diameter greater than that of its previous semicircle and extending outward in the radial direction at a next turnaround portion until an outermost semicircle is reached, the heat generating element 100 is formed into a shape similar to a spiral swirling outward in an alternate circumferential directions along concentric semicircles. When the outermost semicircle is reached, the heat generating element 100 extends along the outermost semicircle and then extends in a radially inward direction at a turnaround portion. By repeating the pattern which includes extending in a reversing direction along a next semicircle with a diameter smaller than that of its previous semicircle and extending in the radially inward direction at a next turnaround portion until the other end of the end portions 102 is reached.

As described above, the heat generating element 100 has a winding structure including a plurality of arc portions arranged along concentric semicircles and a plurality of turnaround portions whereat an extending direction of the heat generating element 100 is reversed. The heat generating element 100 is in communication from one end of the end portion 102 of the heat generating element 100 to the other end of the end portion 102 of the heat generating element 100 through the plurality of arc portions and the plurality of turnaround portions. The turnaround portions are arranged with angular distances therebetween in the circumferential direction such that the turnaround portions of the heat generating element 100 are not adjacent to one another in the radial direction.

The heat generating element 100 is configured such that a width (also referred to as a "line width") of the heat generating element 100 in an outer peripheral region C2 is greater than a width of the heat generating element 100 in a central region C1. That is, when the width of the heat generating element 100 in the outer peripheral region C2 is indicated by "A" and the width of the heat generating element 100 in the central region C1 is indicated by "B", A is greater than B. In the present specification, the central region C1 refers to a region corresponding to the low temperature portion of the upper wafer, and the outer peripheral region C2 refers to a region outside the central region C1 and corresponding to the high temperature portion of the upper wafer. With the configuration of the heat generating element 100 described above, it is possible to make the current density of the central region C1 greater than the current density of the outer peripheral region C2, and to increase the heat generating amount at the central region C1 greater than the heat generating amount at the outer peripheral region C2. Therefore, it is possible to make the temperature of the central region C1 higher than the temperature of the outer peripheral region C2.

In addition, the heat generating element 100 is configured such that a distance between adjacent arc portions of the heat generating element 100 in the outer peripheral region C2 is greater than a distance between adjacent arc portions of the heat generating element 100 in the central region C1. That is, when the distance between adjacent arc portions of the heat generating element 100 in the outer peripheral region C2 is indicated by "C" and the distance between adjacent arc portions of the heat generating element 100 in the central region C1 is indicated by "D", C is greater than D. With the configuration of the heat generating element 100 described above, it is possible to make the surface load density of the central region C1 greater than the surface load density of the outer peripheral region C2, and to increase the heat generating amount at the central region C1 greater than the heat generating amount at the outer peripheral region C2. Therefore, it is possible to make the temperature of the central region C1 higher than the temperature of the outer peripheral region C2.

Figure 9:
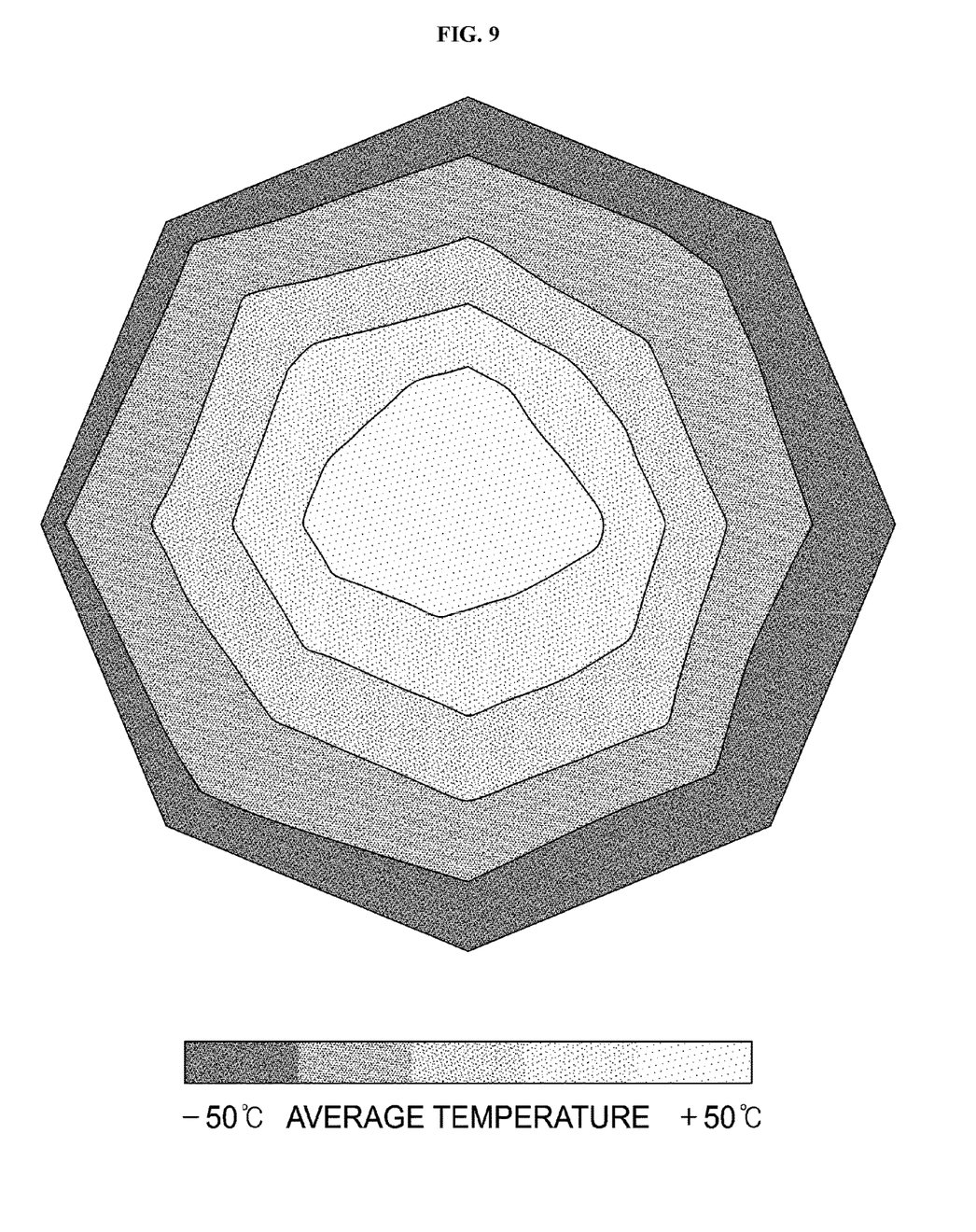
FIG. 9 schematically illustrates a temperature distribution of the ceiling heater according to the embodiments described herein.

FIG. 9 schematically illustrates a temperature distribution of the ceiling heater 31 according to the embodiments when the ceiling heater 31 heats the upper wafer. Referring to FIG. 9, the temperature distribution of the ceiling heater 31 is a convex distribution in which the temperature of the ceiling heater 31 at a central portion is approximately 100° C. greater than the temperature of the ceiling heater 31 at an outer peripheral portion. When elevating the temperature, a temperature deviation on the surface of the wafer such as the upper wafer is about twice as high as a temperature elevating rate. However, it is possible to reduce the temperature deviation on the surface of the wafer such as the upper wafer by using the ceiling heater 31 capable of heating the wafer such as the upper wafer into the convex temperature distribution according to the embodiments.

An area ratio between the central region C1 and the outer peripheral region C2, that is, for example, a value obtained by dividing an area of the central region C1 by an area of the outer peripheral region C2, is preferably set to 0.5 or more and 1.5 or less. When the area ratio is less than 0.5, the heating to the low temperature portion of the upper wafer may be insufficient. When the area ratio is greater than 1.5, the high temperature portion of the upper wafer may be heated more than necessary. By setting the area ratio to 0.5 or more and 1.5 or less, it is possible to adjust the heating amount distribution of the ceiling heater 31 according to the temperature distribution on the surface of the upper wafer. Therefore, it is possible to make the temperature distribution on the surface of the upper wafer uniform.

<Effects of the First Embodiment>

According to the first embodiment described above, it is possible to provide at least one or more of the following effects.

(1) By setting the outer diameter of the ceiling heater to be equal to or greater than the outer diameter of the wafer, it is possible to secure a sufficient heat generating amount for heating the upper wafer (for example, the uppermost wafer). Thereby, it is possible to improve the temperature uniformity on the surface of the upper wafer and the temperature uniformity between the wafers among the plurality of the wafers. As a result, it is possible to shorten the time for stabilizing the temperature of the plurality of the wafers, and to improve the productivity.

(2) By changing the width of the heat generating element of the ceiling heater at any locations, it is possible to change the current density of the ceiling heater at that locations. That is, by narrowing the width of the heat generating element in a region to be mainly heated, it is possible to increase the current density in the region and to increase the heat generating amount in the region. As a result, it is possible to mainly heat the low temperature portion of the upper wafer, and to improve the temperature uniformity on the surface of the upper wafer.

(3) By changing the distance (pitch) between the adjacent arc portions of the heat generating element of the ceiling heater at any locations, it is possible to change the surface load density of the ceiling heater at that locations. That is, by decreasing the pitch between the adjacent arc portions of the heat generating element in a region to be mainly heated, it is possible to increase the surface load density in the region and to increase the heat generating amount in the region. As a result, it is possible to mainly heat the low temperature portion of the upper wafer, and to improve the temperature uniformity on the surface of the upper wafer.

(4) Since the turnaround portions of the heat generating element are arranged with angular distances therebetween in the circumferential direction such that the turnaround portions are not adjacent to one another, it is possible to improve a heating uniformity of the ceiling heater in the circumferential direction. There is a space in the vicinity of each of the plurality of the turnaround portions of the ceiling heater. Therefore, if the turnaround portions are adjacent to each other, the surface load density would decrease where the turnaround portions are adjacent. However, according to the present embodiments, the arc portions of the heat generating element substantially surrounds the space in the vicinity of the turnaround portions by preventing the turnaround portions from being adjacent to each other. Therefore, it is possible to compensate the decrement in the surface load density at that space, and to improve a heating performance of the ceiling heater.

(5) By providing the end portions of the heat generating element connected to the power feed lines at the center of the ceiling heater, it is possible to suppress the positional displacement and the deterioration of the heat generating element. When the heat generating element is heated, the heat generating element may expand. However, when the end portions of the heat generating element is disposed at the center of the ceiling heater, since the expansion of the heat generating element occurs outward in the radial direction, the positional deviation from the center of the ceiling heater does not occur. In addition, by setting the pitch of the heat generating element in consideration of the expansion coefficient of the heat generating element, it is possible to prevent contact between the adjacent arc portions of the heat generating element, and to extend the service life of the heat generating element.

Second Embodiment

Figure 10:
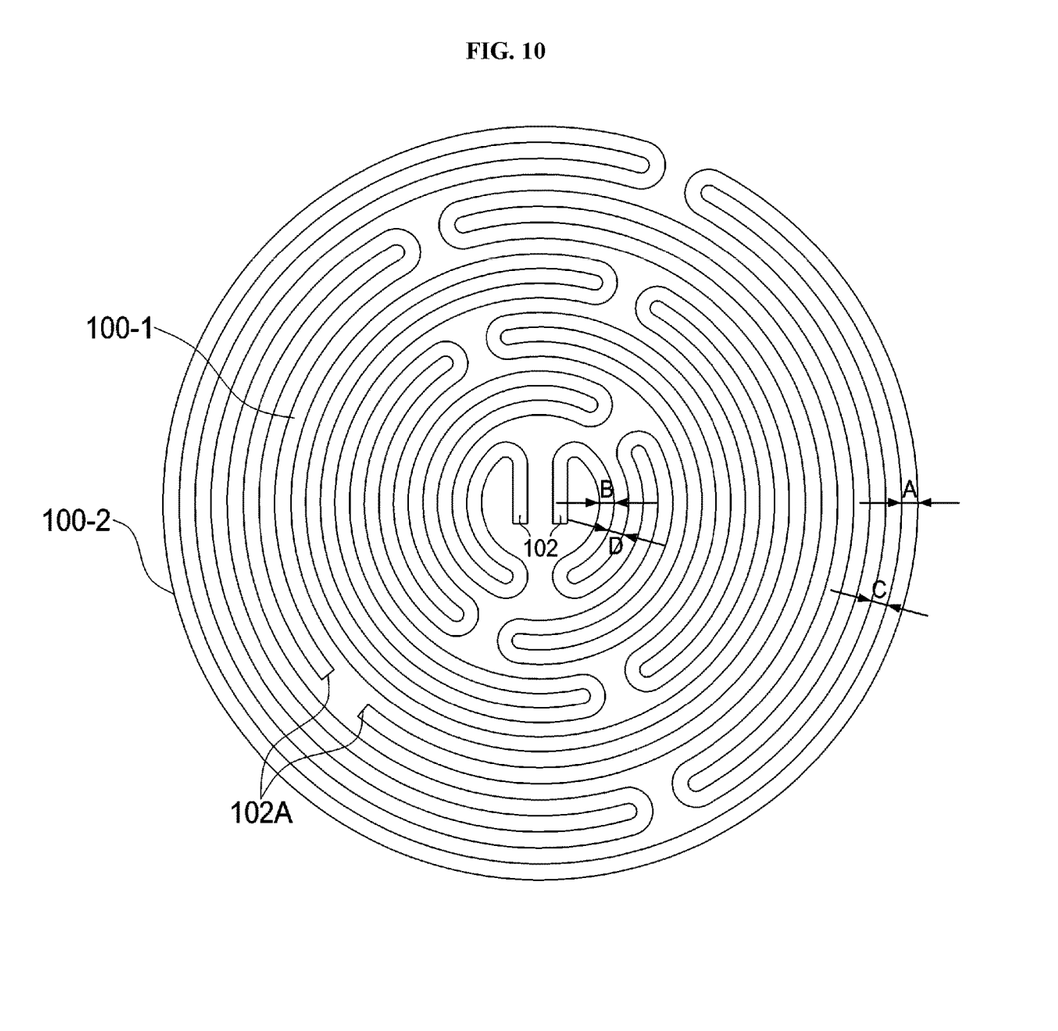
FIG. 10 schematically illustrates a ceiling heater according to a modified example of the embodiments described herein when viewed from above.

As shown in FIG. 10, the heat generating element 100 may be divided into two portions, that is, a central portion 100-1 and an outer peripheral portion 100-2. According to the second embodiment, for example, terminals (end portions) 102A of the outer peripheral portion 100-2 are disposed at locations not adjacent to an outermost turnaround portion of the central portion 100-1, and is preferably disposed at the innermost periphery of the outer peripheral portion 100-2.

According to the second embodiment, the second temperature sensor 28 is configured to measure the temperatures of both the central portion 100-1 and the outer peripheral portion 100-2. That is, the second temperature sensor 28 measures the temperature of the central portion 100-1 and the temperature of the outer peripheral portion 100-2 independently, and the heater driving device 76-5 is configured to supply the electric power to the central portion 100-1 and the outer peripheral portion 100-2 independently.

With the configuration according to the second embodiment described above, since the electric power applied to the central portion 100-1 can be made different from the electric power applied to the outer peripheral portion 100-2, the heat generating amount of the central portion 100-1 can also be made different the heat generating amount of the outer peripheral portion 100-2. Therefore, it is possible to adjust the temperature distribution of the ceiling heater 31 to a convex distribution or a concave distribution. For example, by setting the amount of the electric power applied to the outer peripheral portion 100-2 at least greater than the amount of electric power applied to the central portion 100-1, it is possible to adjust the temperature distribution of the ceiling heater 31 to the concave distribution.

In addition, similar to the first embodiment, it is possible to individually change the width of the heat generating element of the ceiling heater 31 divided into two and the distance (pitch) between adjacent arc portions of the heat generating element of the ceiling heater 31, in each of the central portion 100-1 and the outer peripheral portion 100-2. Also, the heat generating element 100 is in communication from one end of the end portion 102(102A) of the heat generating element 100 to the other end of the end portion 102(102A) of the heat generating element 100 through the plurality of arc portions and the plurality of turnaround portions.

<Effects of the Second Embodiment>

According to the second embodiment described above, as in the first embodiment, it is possible to provide at least one or more of the effects (1) through (5) described above. In particular, it is possible to improve the temperature uniformity on the surface of the upper wafer.

In addition, since the electric power applied to the central portion 100-1 can be made different from the electric power applied to the outer peripheral portion 100-2 it is possible to adjust the temperature distribution of the ceiling heater 31 to a convex distribution when elevating the temperature. Therefore, by turning on the ceiling heater 31 when elevating the temperature of the plurality of the wafers, it is possible to further improve the temperature controllability of the upper wafer, and to improve the temperature uniformity on the surface of the upper wafer. As a result, it is possible to shorten the time for stabilizing the temperature of the plurality of the wafers, and to improve the productivity.

Other Embodiments

While the technique is described in detail based on the above-described embodiments such as the first embodiment and the second embodiment, the above-described technique is not limited thereto. The above-described technique may be modified in various ways without departing from the gist thereof.

Modified Examples

While the first and second embodiments are described by way of an example in which the distance (pitch) and the width of the heat generating element are changed in two regions, that is, the central region and the outer peripheral region, the distance (pitch) or the width of the heat generating element may be changed in at least three regions. For example, the pitch or the width of the heat generating element may be changed such that the heating amount distribution of the ceiling heater may be changed in three regions, that is, a first low temperature region, a high temperature region and a second low temperature region disposed concentrically from the center of the ceiling heater. In addition, the pitch or the width of the heat generating element may be changed such that the heating amount distribution of the ceiling heater may be made to follow a fan-like distribution instead of a concentric distribution, or such that the heating amount distribution of the ceiling heater may only partially follow the fan-like distribution. It is possible to implement the modified examples described above by increasing the surface load density or the current density of a high temperature portion of the heat generating element whose temperature is to be increased than the surface load density or the current density of a low temperature portion of the heat generating element whose temperature is to be decreased. That is, by appropriately combining the surface load density and the current density by changing the pitch and the width of the heat generating element, it is possible to obtain an arbitrary heating amount distribution.

The technique described above based on the embodiments and the modified examples can be applied to a vertical type processing apparatus capable of batch-processing a plurality of objects (substrates).

According to the embodiments in the present disclosure, it is possible to shorten the time for stabilizing the temperature of a plurality of substrates (wafers).

What is claimed is:

1. A substrate processing apparatus comprising:
   a reaction tube accommodating therein a plurality of substrates vertically arranged; and
   a first heater configured to heat an inside of the reaction tube from an upper portion of the reaction tube with a heat generating element divided into two portions comprising a central portion and an outer peripheral portion in a manner that the central portion and the outer peripheral portion are heated individually by adjusting a heating amount of each of the central portion and the outer peripheral portion, and
   wherein end portions of the outer peripheral portion are not adjacent to outermost turnaround portions of the heat generating element, and turnaround portions of the heat generating element are not adjacent to the end portions in a direction outward from a center of the heat generating element in the outer peripheral portion of the heat generating element.

2. The substrate processing apparatus of claim 1, wherein a current density of the first heater in region corresponding to a low temperature portion of an upper substrate among the plurality of substrates accommodated in the reaction tube is greater than a current density of the first heater in a region corresponding to a high temperature portion of the upper substrate.

3. The substrate processing apparatus of claim 2, wherein the region corresponding to the low temperature portion of the upper substrate is a central portion of the first heater, and the region corresponding to the high temperature portion of the upper substrate is an outer peripheral portion of the first heater.

4. The substrate processing apparatus of claim 3, wherein a line width of the heat generating element of the first heater at the outer peripheral portion is greater than a line width of the heat generating element of the first heater at the central portion.

5. The substrate processing apparatus of claim 4, wherein a distance between adjacent portions of the heat generating element of the first heater at the outer peripheral portion is greater than a distance between adjacent portions of the heat generating element of the first heater at the central portion.

6. The substrate processing apparatus of claim 5, wherein an end portion of the central portion of the heat generating element is disposed in a vicinity of a center of the first heater.

7. The substrate processing apparatus of claim 1, wherein the heat generating element comprises a plurality of arc portions extending along concentric semicircles and the turnaround portions whereat an extending direction of the heat generating element is reversed, wherein the heat generating element is in communication from one end of end portion of the heat generating element to the other end of the end portion of the heat generating element through the plurality of arc portions and the turnaround portions.

8. The substrate processing apparatus of claim 1, wherein a diameter of the first heater is equal to or greater than a diameter of an upper substrate among the plurality of substrates accommodated in the reaction tube.

9. The substrate processing apparatus of claim 1, wherein a central portion of the first heater and an outer peripheral portion of the first heater are controllable independently from each other.

10. The substrate processing apparatus of claim 1, further comprising:
    a second heater configured to heat the inside of the reaction tube from a side portion of the reaction tube;
    a first detector configured to detect a temperature of the first heater;
    a second detector configured to detect a temperature of the second heater; and
    a controller configured to control the first heater and the second heater based on values detected by the first detector and the second detector.

11. The substrate processing apparatus of claim 1, wherein a ratio of an area of the central portion of the heat generating element to an area of the outer peripheral portion of the heat generating element is within a range from 0.5 to 1.5.

12. The substrate processing apparatus of claim 1, wherein the heat generating element is a winding structure having a shape of a spiral swirling outward from the center of the heat generating element along concentric semicircles.

13. The substrate processing apparatus of claim 1, wherein feed ends to which power feed lines are connected are disposed at the central portion of the heat generating element.

14. The substrate processing apparatus of claim 1, wherein turnaround portions of the central portion are radially arranged from a center of the central portion.

15. The substrate processing apparatus of claim 1, wherein turnaround portions of the central portion are arranged in a manner that each of the turnaround portions of the central portion are located on a different straight line extending from an end portion of the central portion to an outer periphery of the central portion.

16. The substrate processing apparatus of claim 1, wherein the turnaround portions of the heat generating element are adjacent to an end portion of the central portion of the heat generating element.

17. The substrate processing apparatus of claim 1, wherein a heat generating amount of the first heater in a region corresponding to a low temperature portion of an upper substrate among the plurality of substrates accommodated in the reaction tube is greater than a heat generating amount of the first heater in a region corresponding to a high temperature portion of the upper substrate.

* * * * *